(12) United States Patent
Kaneda et al.

(10) Patent No.: US 6,265,935 B1
(45) Date of Patent: Jul. 24, 2001

(54) AMPLIFIER FOR RADIO TRANSMISSION (75) Inventors: Ryuusuke Kaneda, Yokohama; Seiji Hagiwara; Tadao Takami, both of Yokosuka, all of (JP)

(73) Assignee: NTT Mobile Communications Network Inc., Tokyo (JP)

( * ) Notice: Subject to any disclaimer, the term of this patent is extended or adjusted under 35 U.S.C. 154(b) by 0 days.

(21) Appl. No.: 09/403,273

(22) PCT Filed: Feb. 19, 1999

(86) PCT No.: PCT/JP99/00801

§ 371 Date: Oct. 18, 1999

§ 102(e) Date: Oct. 18, 1999

(87) PCT Pub. No.: WO99/43083

PCT Pub. Date: Aug. 26, 1999

(30) Foreign Application Priority Data

Feb. 19, 1998 (JP) .................................................. 10-037626

(51) Int. Cl.[7] ...................................................... H03F 1/14
(52) U.S. Cl. .............................. 330/51; 330/133; 330/297
(58) Field of Search .............................. 330/51, 133, 134, 330/150, 151, 296, 297

(56) References Cited

U.S. PATENT DOCUMENTS

| | | |
|---|---|---|
| 4,213,097 | 7/1980 | Chiu et al. . |
| 4,357,577 * | 11/1982 | Smither ................................. 330/51 |
| 4,910,478 * | 3/1990 | Koyama ............................... 330/278 |
| 5,115,203 | 5/1992 | Krett et al. . |
| 5,374,895 * | 12/1994 | Lee et al. ............................... 330/51 |
| 5,530,923 * | 6/1996 | Heinonen et al. .................... 455/126 |
| 5,661,434 | 8/1997 | Brozovich et al. . |
| 5,909,643 | 6/1999 | Aihara . |

FOREIGN PATENT DOCUMENTS

| | | | |
|---|---|---|---|
| 2 326 782 | 12/1998 | (GB) . | |
| 55-097714 | 7/1980 | (JP) . | |
| 55-92009 * | 12/1980 | (JP) | ...................................... 330/51 |
| 60-212013 | 10/1985 | (JP) . | |
| 2-43011 | 3/1990 | (JP) . | |
| 4-54405 | 2/1992 | (JP) . | |
| 09064757 | 3/1997 | (JP) . | |
| WO 97/41642 | 11/1997 | (WO) . | |

* cited by examiner

Primary Examiner—Robert Pascal
Assistant Examiner—Henry Choe
(74) Attorney, Agent, or Firm—Connolly Bove Lodge & Hutz

(57) ABSTRACT

In a radio transmission amplifier unit which has between input and output terminals a gain-controlled amplifier 11, a pre-amplifier 12 connected to the output thereof and a main amplifier 13 supplied with the output therefrom, the range of the transmitting power level is divided into small, medium and large regions. In the small transmitting power level region, the power supply to the pre- and main amplifiers is cut off by power-supply switches 28 and 29 and the output of the gain-controlled amplifier 11 is connected to a terminal 14 via switches 15, 18 and 19; in the medium transmitting power level region, the power-supply switch 28 is turned ON and the switch 29 OFF to connect the switch 15 to the pre-amplifier and the output of the pre-amplifier is connected to the terminal 14 via switches 21 and 19; and in the large transmitting power level region, the power-supply switches 28 and 29 are turned ON to connect the switch 15 to the pre-amplifier, a switch 16 is connected to the main amplifier, and the output of the main amplifier is connected to the terminal 14 via the switch 19.

18 Claims, 10 Drawing Sheets

AMPLIFIER FOR RADIO TRANSMISSION

TECHNICAL FIELD

The present invention relates to a radio transmission amplifier unit for use, for instance, in a mobile communication system that requires substantial control of the transmitting power from each mobile station.

PRIOR ART

For example, in a CDMA-based mobile communication system the base station sends a transmitting power control signal to respective mobile stations to control their transmitting powers so as to make the receiving levels of transmitting waves from any mobile stations substantially constant regardless of the distances between the mobile stations and the base station, thereby reducing interference that is attributable to the difference in receiving level among channels assigned with different spreading codes.

Figure 1A:
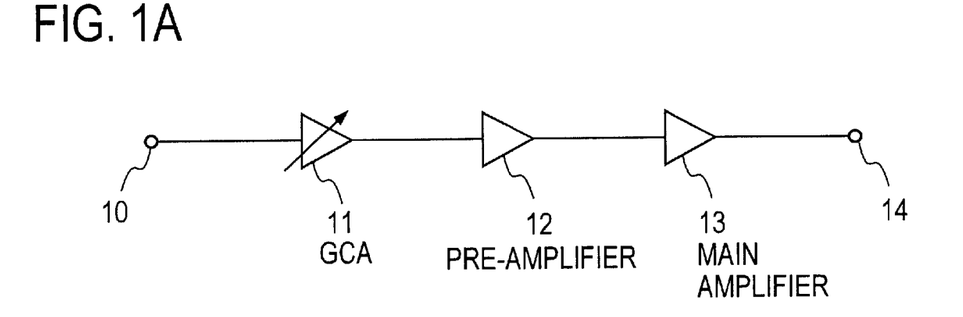
FIG. 1A is a diagram depicting a radio transmission amplifier unit in a conventional radio transmitter.

In FIG. 1A there is depicted a conventional radio transmission amplifier unit that forms part of a radio transmitter of a mobile station. The radio transmission amplifier unit has a variable gain-controlled amplifier (GCA) 11, a pre-amplifier 12 and a main amplifier 13. An input signal from an input terminal 10 is amplified by GCA 11, then its output is amplified by the pre-amplifier 12, and the amplified output is further amplified by the main amplifier 13 having a gain larger than that of the pre-amplifier 12, thereafter being provided to an output terminal 14. Though different according to its kind, the mobile station performs transmission, for example, with a maximum rated transmitting power of 0.3 W, normally, tens of milliwatts or so, for instance. Upon each reception of a transmitting-power-increase control signal from the base station, the mobile station controls GCA 11 to increase the transmitting power by a predetermined gain (dB), whereas, upon each reception of a transmitting-power-decrease control signal, it controls GCA 11 to decrease the transmitting power by a predetermined gain (dB).

Figure 1B:
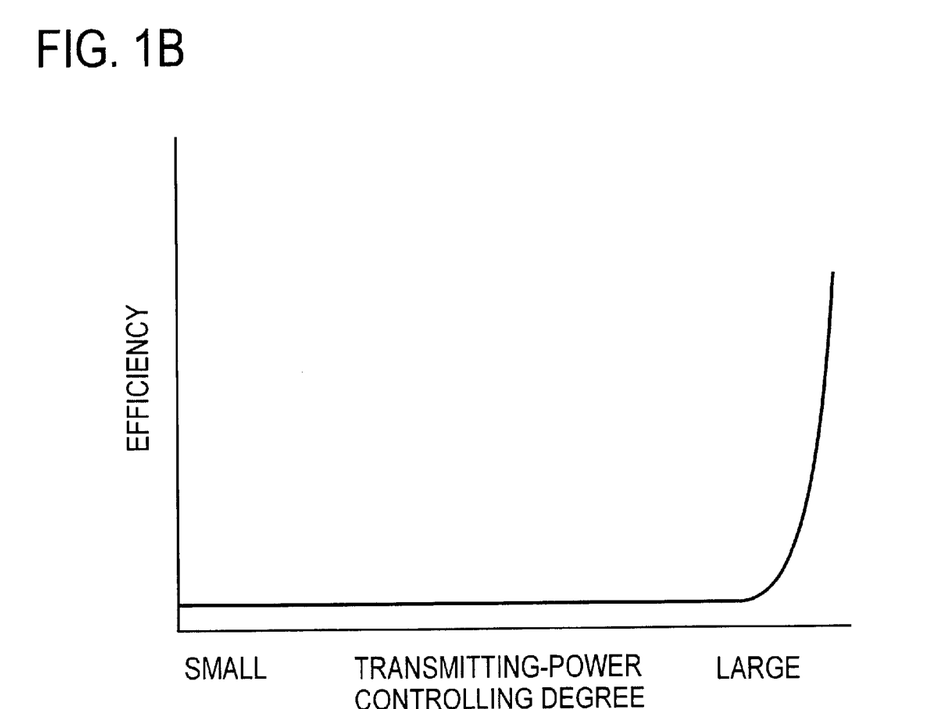
FIG. 1B is a graph showing the operation efficiency of the amplifier unit with respect to the transmitting power controlling degree.

FIG. 1B shows, by way of example, an increase in the transmitting power controlling degree and variations in the operation efficiency of such a radio transmission amplifier unit by repeated reception of the transmitting-power-increase control signal. The conventional radio transmission amplifier unit is so designed as to provide maximum efficiency when the transmitting power is at the maximum as shown in FIG. 1B. Consequently, when the transmitting power is low, the operation efficiency considerably decreases, resulting in a waste of power. This is particularly detrimental to a mobile station that uses a battery as the power supply as in the case of a portable telephone.

An object of the present invention is to provide a radio transmission amplifier unit which retains high efficiency even during its operation with a transmitting power smaller than the rating.

DISCLOSURE OF THE INVENTION

According to a first aspect of the present invention, a radio transmission amplifier unit, which amplifies a signal fed to an input terminal and provides it to an output terminal, is constructed to comprise:

a plurality of amplifiers provided between said input terminal and said output terminal and each having a power-supply terminal;

power supply means for supplying power to said plurality of amplifiers;

power-supply switching means for selectively connecting said power supply means to the power-supply terminals of said plurality of amplifiers to supply thereto power;

route switching means for switching the cascade connection of said plurality of amplifiers to connect the output of a selected one of said amplifiers to said output terminal; and control signal generating means for generating switch control signals which specify the states of connection by said power-supply switching means and said route switching means in accordance with a transmitting power controlling degree corresponding to the transmitting power level and for applying said switch control signals to said power-supply switching means and said route switching means, respectively.

The radio transmission amplifier unit according to said first aspect of the invention may also be constructed so that first and second bias voltages are selectively supplied by a bias select switching means from said power supply means to the input sides of said plurality of amplifiers.

According to a second aspect of the present invention, a radio transmission amplifier unit, which amplifies a signal fed to an input terminal and provides it to an output terminal, is constructed to comprise:

a plurality of amplifiers connected in cascade between said input terminal and said output terminal, each amplifier having a power supply terminal;

power supply means for outputting at least first and second bias voltages;

bias select switching means for selectively applying either one of said first and second bias voltages to the input sides of said plurality of amplifiers to thereby selectively set their operating points; and control signal generating means for generating a bias control signal which controls the selection of said bias select switching means in correspondence to the transmitting power level.

BRIEF DESCRIPTION OF THE DRAWINGS

FIG. 12 is a graph showing how distortion is compensated for; and

BEST MODE FOR CARRYING OUT THE INVENTION

Figure 2A:
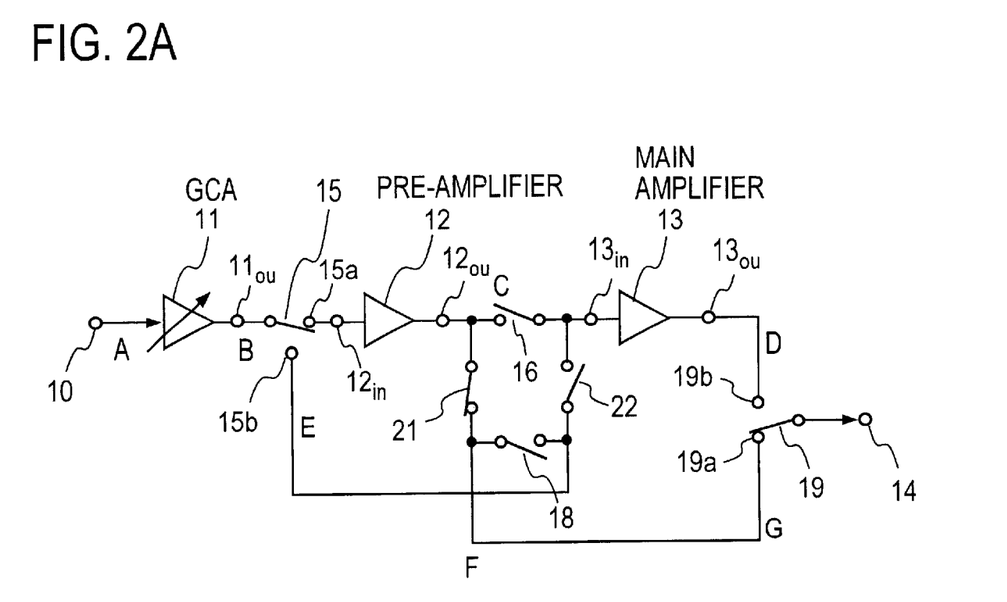
FIG. 2A is a connection diagram depicting three amplifiers and switches for switching their connection in a first embodiment of the radio transmission amplifier unit according to the present invention.

In FIG. 2A there are depicted amplifiers 11, 12 and 13 and switches 15, 16, 18, 19, 21 and 22 for selectively switching them in or out of a signal path in a first embodiment of the radio transmission amplifier unit according to the present invention, the parts corresponding to those in FIG. 1A being identified by the same reference numerals. The switch 15 is connected in series between the output end $11_{ou}$ of the gain-controlled amplifier 11 and the input end $12_{in}$ of the pre-amplifier 12, and the switch 16 is connected in series between the output end $12_{ou}$ of the pre-amplifier 12 and the input end $13_{in}$ of the main amplifier 13. Provision is made for connecting a selected one of the output ends $11_{ou}$, $12_{ou}$ and $13_{ou}$ of the amplifiers 11, 12 and 13 by select switching means to the output terminal 14. To this end, in the illustrated embodiment the switch 15 is formed by a change-over switch, which has its movable contact connected to the output end $11_{ou}$, its one fixed contact 15a connected to the input end $12_{in}$ and its other fixed contact 15b connected via a switch 18 to one fixed contact 19a of a change-over switch 19, which, in turn, has its movable contact connected to the output terminal 14 and its other fixed contact 19b connected to the output end $13_{ou}$. Further, the output end $12_{ou}$ is connected via a switch 21 to the fixed contact 19a.

When connecting the change-over switch 15 to the fixed contact 15b and turning ON the switch 18 while connecting the change-over switch 19 to the fixed contact 19a, the output end $11_{ou}$ is connected to the output terminal 14; then, when changing over the switch 15 to the fixed contact 15a and turning ON the switch 21, the output end $12_{ou}$ is connected to the output terminal 14; and when connecting the change-over switch 19 to the fixed contact 19b and turning ON the switch 16, the output end $13_{ou}$ is connected to the output terminal 14. That is, the switches 15, 18, 19 and 21 constitute select switch means.

Furthermore, the example of FIG. 2A is adapted so that the fixed contact 15b of the change-over switch 15 can be connected via the switch 22 to the input end $13_{in}$ of the main amplifier 13 to connect thereto the output end $11_{ou}$ of the gain-controlled amplifier 11 so as to bypass the pre-amplifier 12. Hence, by connecting the change-over switch 15 to the fixed contact 15b, then turning OFF the switch 16 and ON the switch 22, and connecting the change-over switch 19 to the fixed contact 19b, the output from the gain-controlled amplifier 11 bypasses the pre-amplifier 12 and is fed to the main amplifier 13, thereafter being amplified and then provided to the output terminal 14. The switches 15, 16 and 22 constitute bypass switch means.

Figure 2B:
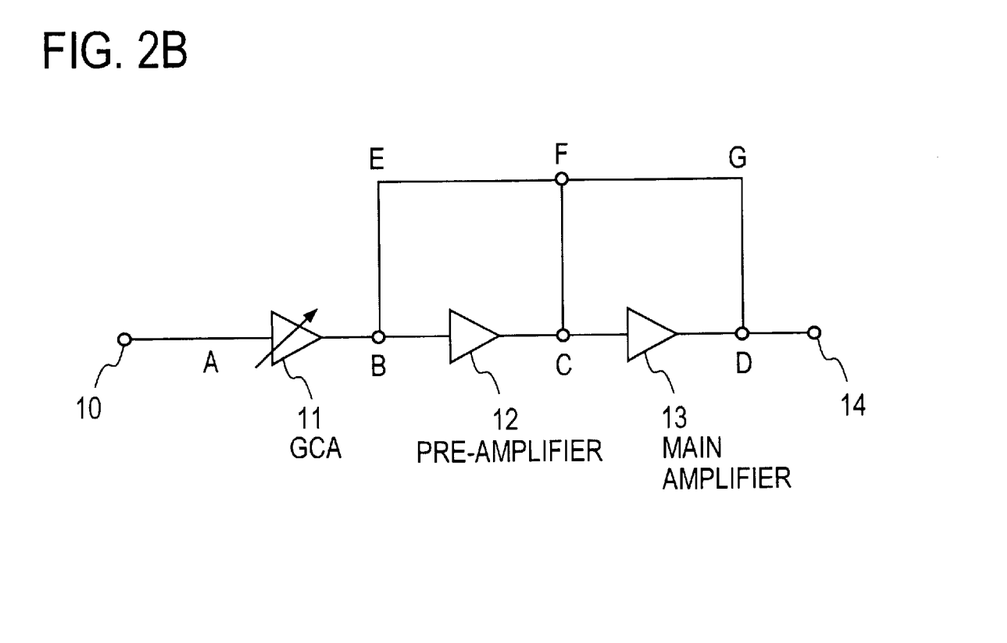
FIG. 2B is a diagram showing, in a simplified form, a signal path in FIG. 2A.

That is, letting the input terminal 10 be represented by A, the connection point of the amplifiers 11 and 12 by B, the connection point of the amplifiers 12 and 13 by C, the output terminal 14 by D, the route that bypasses the pre-amplifier 12 by B-E-F-C and the route that bypasses the main amplifier 13 by C-F-G-D as depicted in FIG. 2B, the amplifier unit of FIG. 2A can take any one of routes A-B-C-D, A-B-C-F-G-D and A-B-E-F-G-D. However, if the pre- and main amplifiers 12 and 13 have not so much different characteristics, there will be no large difference between characteristics of the routes which bypass the pre- and main amplifiers 12 and 13, respectively; therefore, there is no practical need for bypassing the pre-amplifier 12. In such an instance, the switch 22 is not provided and the switch 18 is normally held ON, i.e. connected. Accordingly, the amplifier unit has three selectable states of use, that is, a state in which only the amplifier 11 is made active, a state in which the amplifiers 11 and 12 are made active, and a state in which the amplifiers 11, 12 and 13 are all made active. On the contrary, when the characteristics of the pre- and main amplifiers 12 and 13 greatly differ, the switches 18 and 22 are provided, making it possible to bypass the pre-amplifier 12. In this case, a state in which the amplifiers 11 and 13 are made active is added to the abovementioned three states of use; namely a total of four states of use are selectable. The following description will be given of the case of selecting from the former three states of use.

Figure 3A:
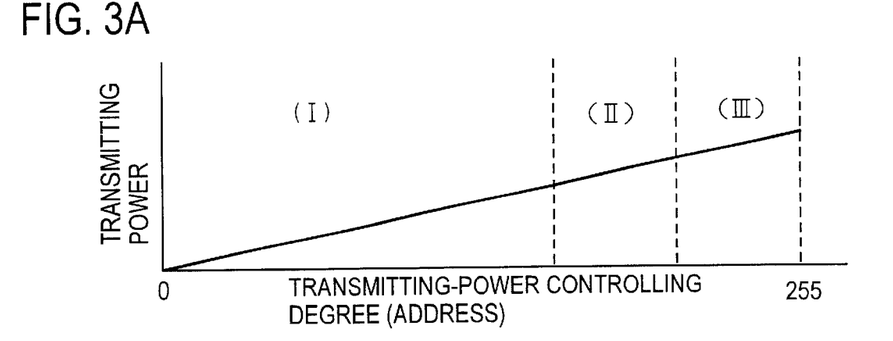
FIG. 3A is a conceptual diagram depicting the general relationship of the transmitting power to its controlling degree.

In the present invention, the transmitting power controlling degree is divided into three regions, i.e. small, medium and large regions (I), (II) and (III) corresponding to the three amplifiers 11, 12 and 13, respectively, as depicted in FIG. 3A; in the small transmitting power controlling region (I) the switch 15 in FIG. 2A is connected to the terminal 15b, the switch 18 is turned ON, the switch 19 is connected to the terminal 19a, and the switches 21 and 22 are turned OFF, whereby the route A-B-E-F-G-D in FIG. 2B is formed. As a result, only the gain-controlled amplifier 11 is actuated and the power supply to the pre- and main amplifiers 12 and 13 is turned OFF. Accordingly, in this region (I) the gain between the route points B and D is 0 dB, and the transmitting power in FIG. 3A is determined only by the gain of the gain-controlled amplifier 11 depicted in FIG. 3C.

In the medium transmitting power control variable region (II), the switch 15 in FIG. 2A is connected to the terminal 15a, the switches 16, 18 and 22 are turned OFF, the switch 19 is connected to the terminal 19a and the switch 21 is turned ON, whereby the route A-B-C-F-G-D is formed. As a result, the amplifiers 11 and 12 are made active and the power supply to the amplifier 13 is turned OFF. Accordingly, in this region (II) the gain between the route points B and D becomes a constant gain by the pre-amplifier 12, and by changing the gain of the gain-controlled amplifier 11 as shown in the region (II) in FIG. 3C, the output characteristic in the medium region (II) depicted in FIG. 3A is obtained. At the instant of switching from the region (I) to the region (II) the gain of GCA 11 is reduced by the gain $G_1$ of the amplifier 12 that is added in the region (II), by which the transmitting power characteristic in FIG. 3A can be made to continue from the region (I) to the region (II).

Figure 3B:
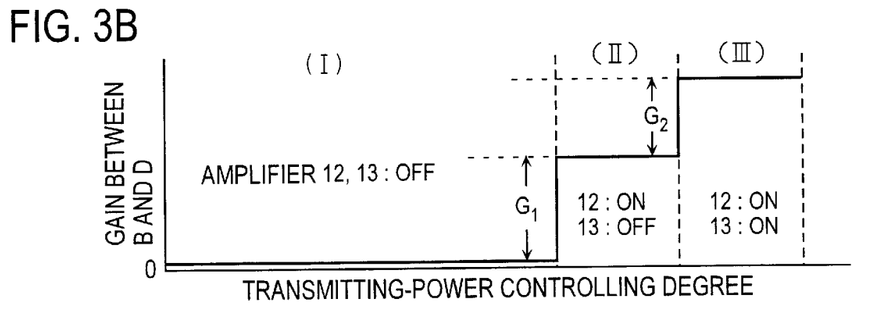
FIG. 3B is a graph showing gain variations between route points B and D with respect to the transmitting power controlling degree with the connection of the three amplifiers selectively switched in the first embodiment of the present invention illustrated in FIG. 2A.
Figure 3C:
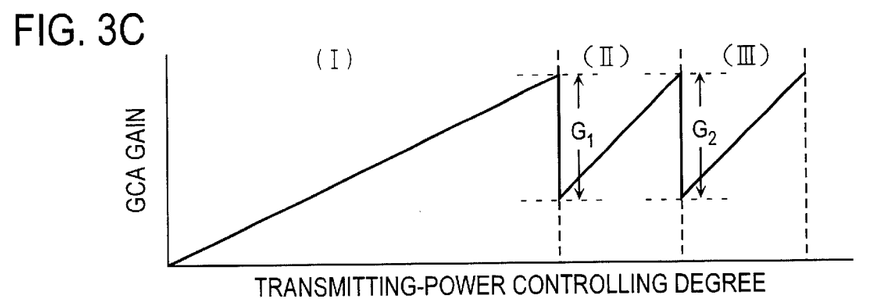
FIG. 3C is a graph showing gain variations of a gain-controlled amplifier 11 with the switches changed over in the first embodiment.

In the large transmitting power controlling region (III) the switch 15 in FIG. 2A is connected to the terminal 15a, the switch 16 is turned ON, the switch 19 is connected to the terminal 19b and the switches 21 and 22 are turned OFF, whereby the route A-B-C-D is formed. As a result, all the amplifiers 11, 12 and 13 are made active. Accordingly, the gain between the route points B and D in this region becomes a constant gain that is determined by the sum of the gains of the amplifiers 12 and 13 as depicted in FIG. 3B; by changing the gain of the gain-controlled amplifier 11 as shown in the region (III) in FIG. 3C, the output characteristic in the region (III) in FIG. 3A is obtained. At the instant of switching from the region (II) to the region (III), the gain of the gain-controlled amplifier 11 is reduced by the gain $G_2$ of the amplifier 13 that is added in the region (II), the transmitting power characteristic in FIG. 3A can be made to continue from the region (II) to the region (III).

Figure 3D:
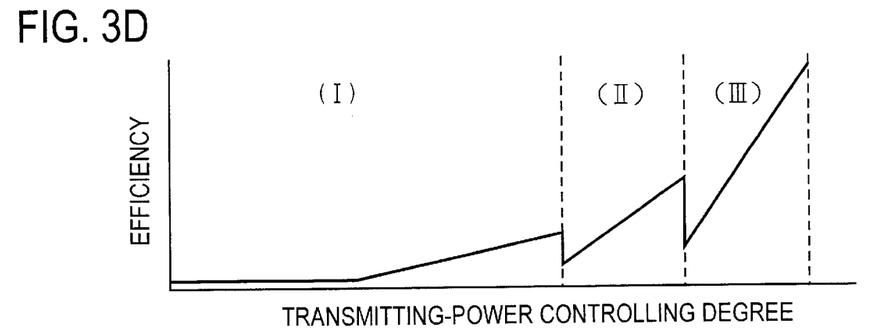
FIG. 3D is a graph showing variations in efficiency with respect to the transmitting power controlling degree with the switches changed over in the first embodiment.

The efficiency of the radio transmission amplifier unit in the three regions (I), (II) and (III) is such as depicted in the corresponding regions in FIG. 3D; in the small output region (I) the power supply to the amplifiers 12 and 13 is held OFF and in the medium output region (II) the power supply to the amplifier 13 is held OFF—this reduces power consumption in either region and enhances the efficiency of the radio transmission amplifier unit as compared with that in the past.

Figure 4:
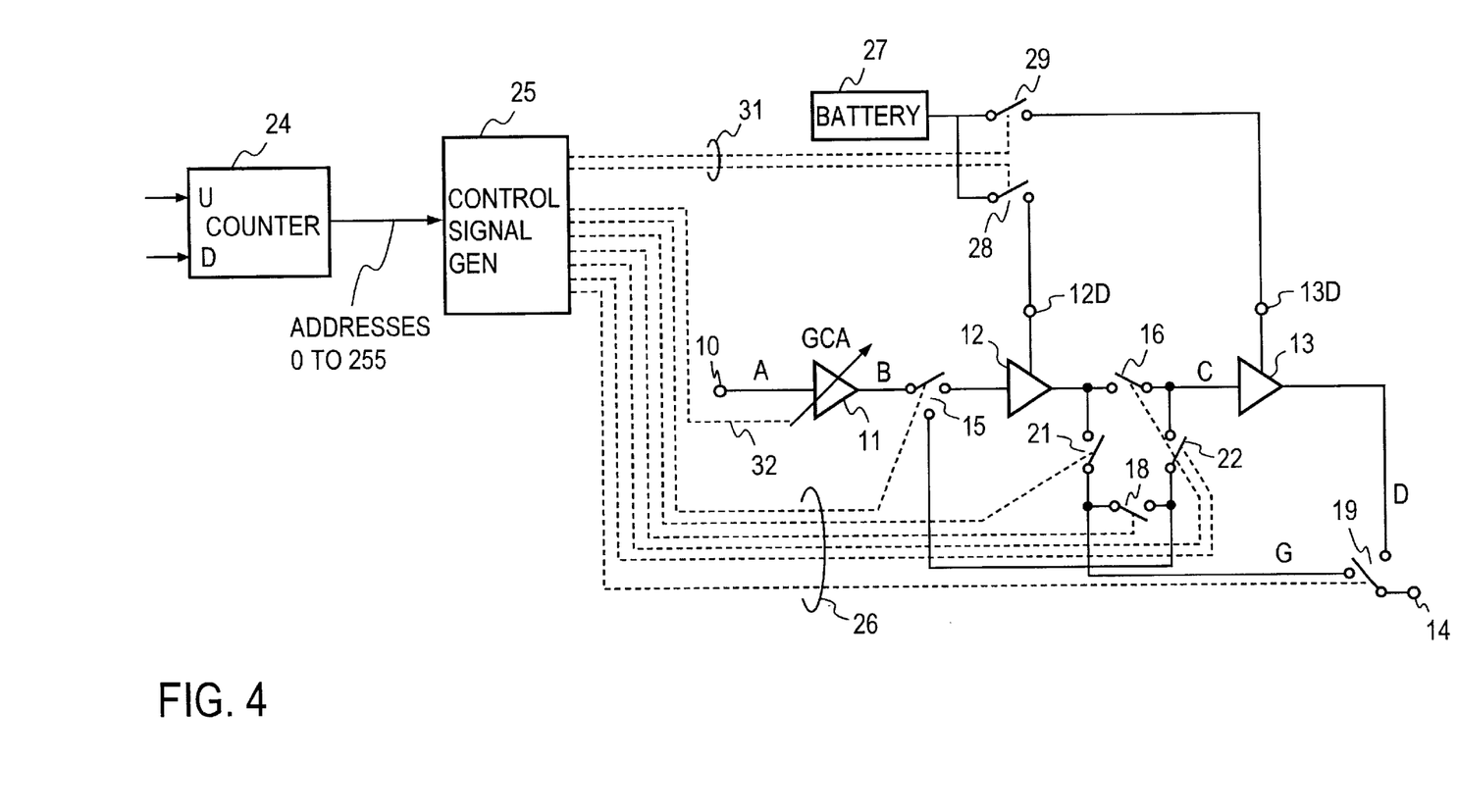
FIG. 4 is a diagram illustrating a first embodiment of the radio transmission amplifier unit according to the present invention.

To implement such control, a control signal generator 25 formed, for example, a memory, is provided as depicted in FIG. 4; the control ranges of the transmitting power controlling degree shown in FIG. 3A are made to correspond to address values 0 through 255 of the memory 25; there are prestored at each address a preset gain of the gain-controlled amplifier 11 for the corresponding transmitting power controlling degree and connection control signals for the switches 15, 16, 18, 19, 21, 22, 28 and 29 in the region (I), (II), or (III) to which the transmitting power controlling degree belongs. There is provided an up-down counter 24 that counts up or down upon each application thereto of the output increase or decrease control signal. The count value of the up-down counter is used as an address corresponding to the transmitting power controlling degree to access the memory (control signal generator) 25, from which are read out a gain value control signal 32 for setting the corresponding gain in the gain-controlled amplifier 11, a switching control signal group 26 for controlling the switches 15, 16, 18, 19, 21 and 22, and an amplifier ON/OFF signal group 31 for making the pre- and main amplifiers 12 and 13 operative or inoperative, that is, for effect ON-OFF control of power-supply switches 28 and 29 inserted between a battery 27 and operating power-supply terminals 12D and 13D of the pre- and main amplifiers 12 and 13, respectively. In response to these switching control signals the respective switched are turned ON and OFF to effect ON/OFF control of the power supply to the amplifiers 12 and 13, and the gain for the gain-controlled amplifier 11 is set.

Figure 5:
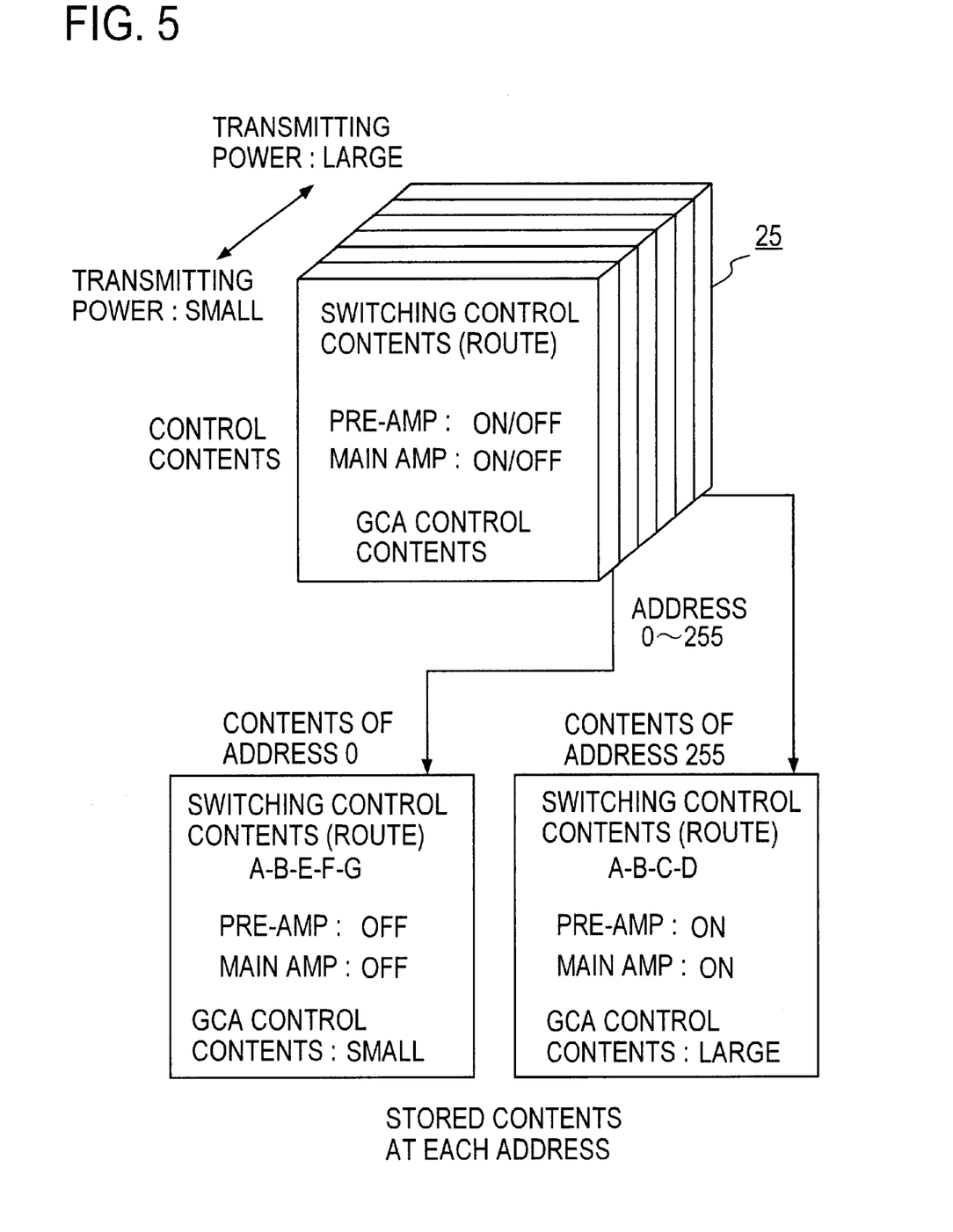
FIG. 5 is a diagram depicting examples of stored contents of a control signal generator 25 formed by a memory in FIG. 4.

That is, as shown in FIG. 5, the control signal generator 25 has prestored, for example, in its area of the address 255 corresponding to the maximum transmitting power controlling degree in the region (III) a switching control signal group for controlling the respective switches to choose the route A-B-C-D in FIG. 2B, an amplifier ON/OFF signal for turning ON the power supply to the main amplifier 13 and turning ON the pre-amplifier 12, and a gain control signal that maximizes the gain of the gain-controlled amplifier 11 within a variable range. In the area of the address 0 corresponding to the minimum transmitting power controlling degree in the region (I), there are stored a switching control signal group for controlling the respective switches to choose the route A-B-E-F-G, a signal for turning OFF the operating power supply to the pre- and main amplifiers 12 and 13, and a gain control signal that minimizes the gain of the gain-controlled amplifier 11 within the variable range.

Simply by setting the required transmitting power controlling degree as an address in the control signal generator 25 as described above, it is possible to effect complex switching control of the switches 15, 16, 18, 19, 21 and 22, ON/OFF control of the power-supply switches 28 and 29 and the setting of the gain for the gain-controlled amplifier 11.

Figure 6A:
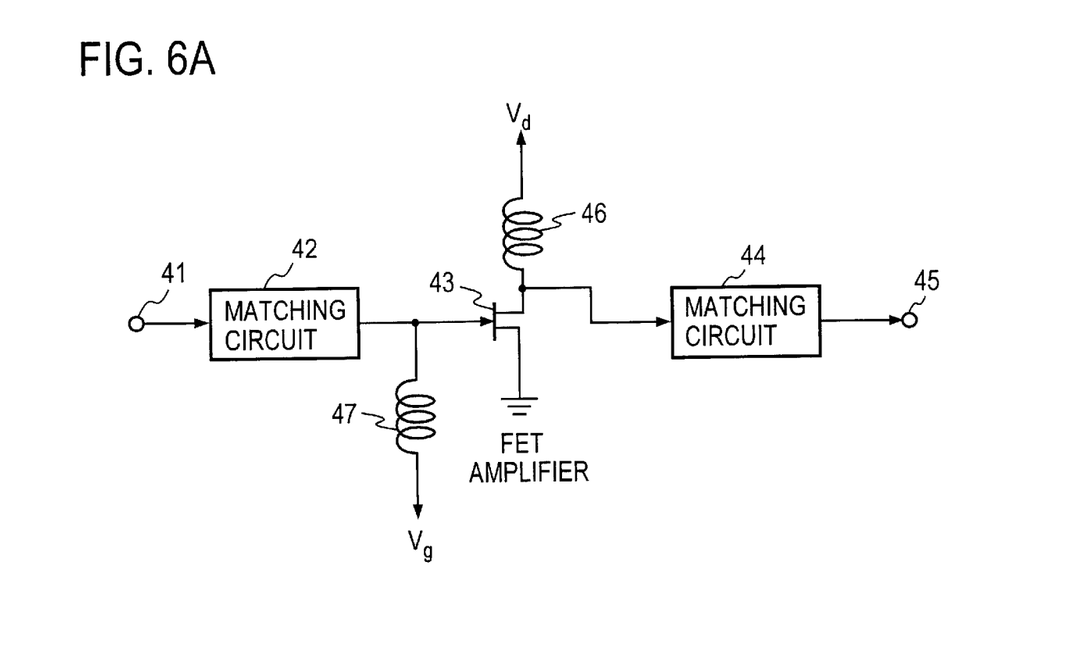
FIG. 6A is a connection diagram illustrating an example in which an amplifier 12 or 13 is formed by an FET.

Either of the pre- and main amplifiers 12 and 13 can be formed by such an FET amplifier as depicted in FIG. 6A. An input from an input terminal 41 is fed via a matching circuit 42 to the gate of an FET 43, the source of the FET 43 is grounded, and an amplified signal is provided from its drain is provided via a matching circuit 44 to an output terminal 45. A drain bias $V_d$ is applied via a high-frequency cut-off coil 46 to the drain of the FET 43, and a gate bias (input-side bias) $V_g$ is applied via a high-frequency cut-off coil 47 to the gate.

Figure 10A:
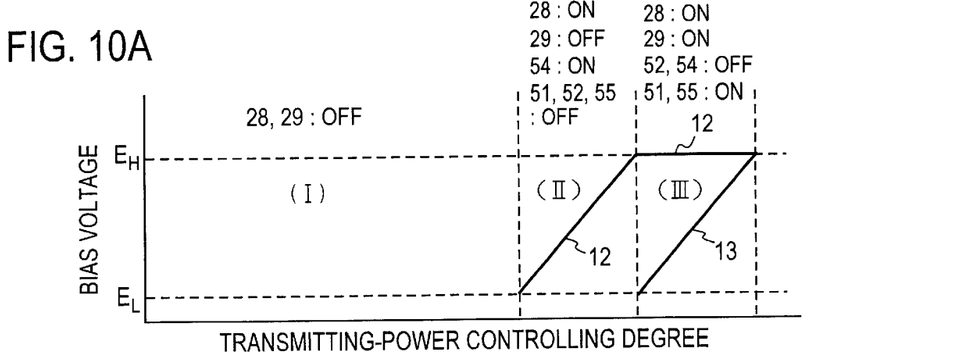
FIG. 10A is a graph showing bias voltage control for the amplifiers 12 and 13 in FIG. 9.
Figure 10B:
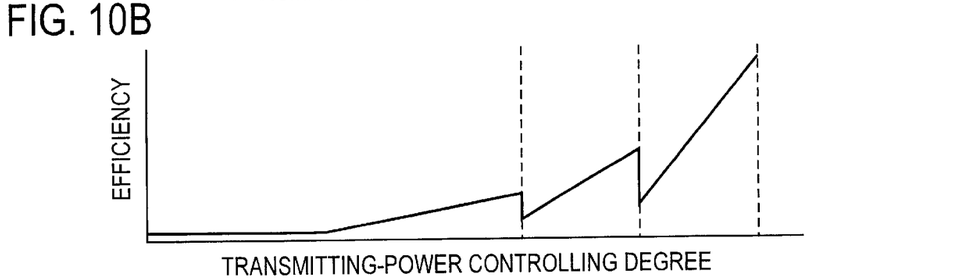
FIG. 10B is a graph showing an example of efficiency with respect to the transmitting power controlling degree.

As shown in FIG. 10A, according to an ordinary amplifier biasing method, an operating point a on a load line A is determined with respect to the maximum permissible input to the amplifier in its drain current characteristic. The load curve A is given by the gate bias $V_g=E_a$. With this bias $V_g=E_a$, the maximum drain current is $I_{amax}$, and by selecting the operating point a such that the drain current $I_a=I_{amax}/2$, it is possible to maximize the input level that can be amplified substantially linearly. However, since the drain current $I_a$ at the operating point a always flows even during the no-input period, the operation efficiency of the amplifier decreases accordingly. Then, when the input signal is small in level, if the operating point is shifted to b by setting the gate bias voltage $V_g$ at $V_g=E_b$ that is smaller than $E_a$ as indicated by the curve B in FIG. 10A, the drain current $I_b$ can be made small when no input is applied or when the input signal level is low; hence, it is possible to improve the operation efficiency of the amplifier. By using this method to lower the gate bias $V_g$ of each of the amplifiers 12 and/or 13 supplied with power in the regions (II) and/or (III) described previously, for example, in respect of FIGS. 3A through 3D, the operating point is shifted to the point b on the load curve B, by which it is possible to suppress impairment of the operation efficiency.

Figure 9:
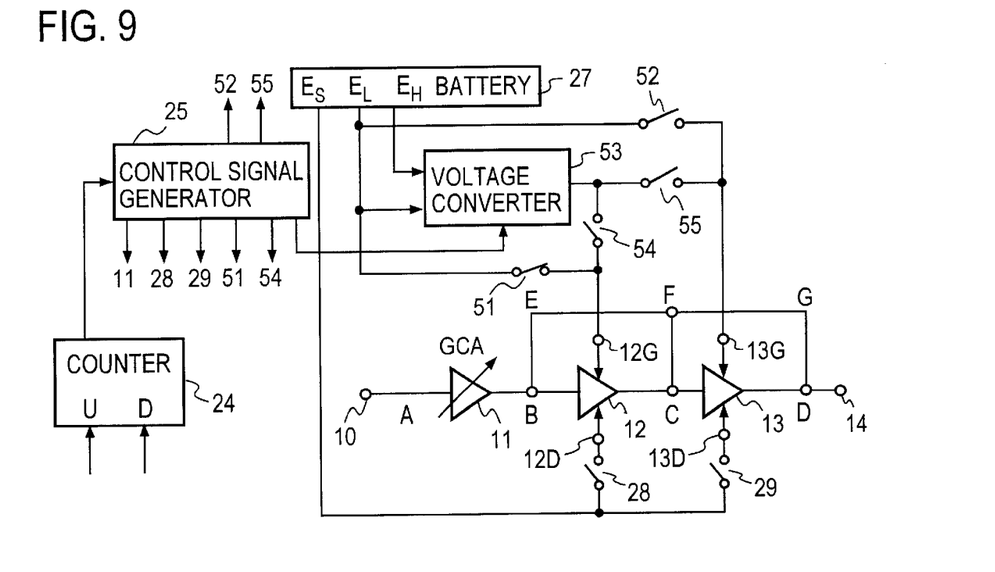
FIG. 9 is a block diagram illustrating a third embodiment of the radio transmission amplifier unit according to the present invention.
Figure 11:
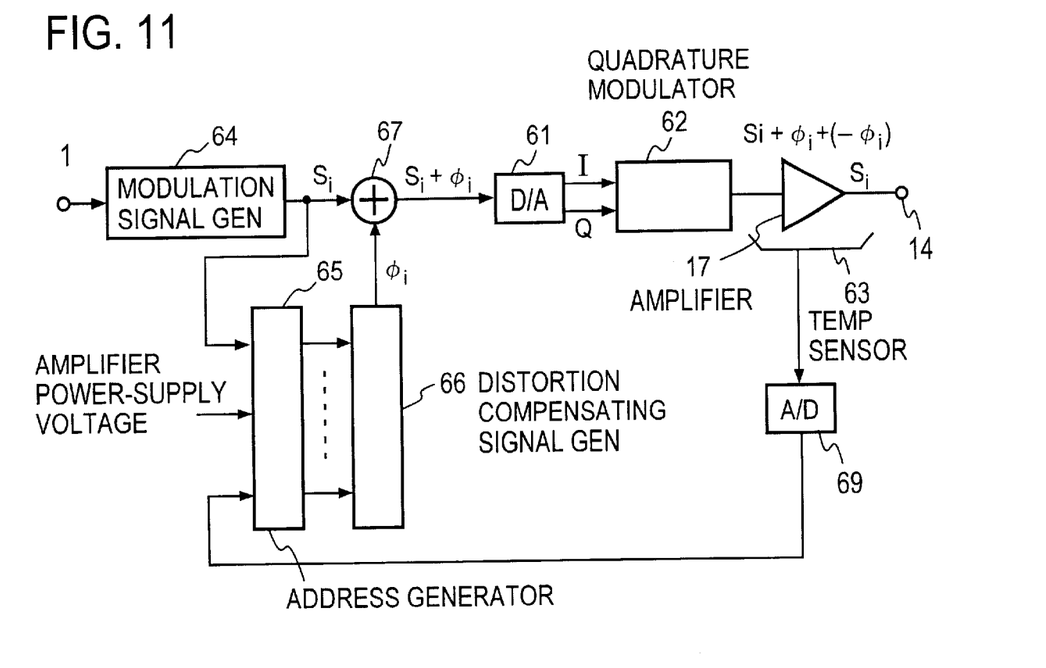
FIG. 11 is a diagram depicting an example of a distortion compensating arrangement of an amplifying section.

In FIG. 11 there is illustrated an embodiment which uses the FET amplifier of FIG. 9 as each of the pre- and main amplifiers 12 and 13 and controls their gate bias voltages $V_g$ to enhance the amplifier efficiency. Between the input terminal 10 and the output terminal 14 there are connected in cascade the gain-controlled amplifier 11, the pre-amplifier 12 and the main amplifier 13, and gate bias voltages are controlled which are applied to terminals 12G and 13G of the pre- and main amplifiers 12 and 13. The battery 27 outputs the maximum bias voltage $E_H$ and the minimum bias voltage $E_L$, which are fed not only to a voltage converter 53 but also to a switch 51, and the bias voltage $E_L$ is applied to a switch 52.

The switch 51 responds to a control signal from the control signal generator 25 to select any one of the maximum bias voltage $E_H$, the minimum bias voltage $E_L$ and its OFF state; this switch is connected to the terminal 12G. The voltage converter 53 responds to a control signal from the control signal generator 25 to output a given address-corresponding voltage within the range of from the minimum bias voltage $E_L$ to the maximum bias voltage $E_H$, and the output voltage is applied to the gate bias terminals 12G and 13G via switches 54 and 55, respectively.

Within the range of values corresponding to the minimum to maximum values of the transmitting power controlling degree, for instance, from 0 to 255, the up-down counter 24 counts up by 1 upon each reception of the output increase control signal from the base station and counts down by 1 upon each reception of the output decrease control signal. The count value is provides, as an address corresponding to the transmitting power controlling degree, to the control signal generator 25 formed by a memory as referred to previously, from which a gain controlling degree for the gain-controlled amplifier 11, connection control signals for the switches 51, 52, 54 and 55 and a bias controlling degree for the voltage converter 53 are read out and applied to the respective parts.

Figure 7:
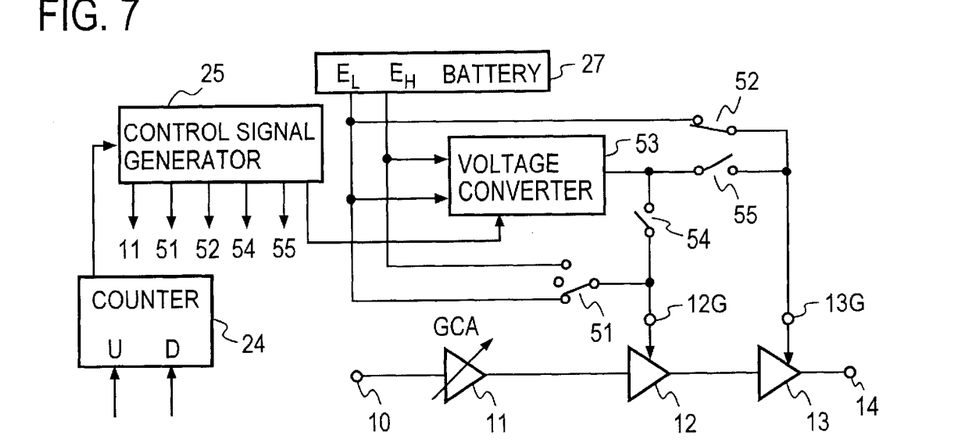
FIG. 7 is a block diagram illustrating a second embodiment of the present invention.
Figure 8A:
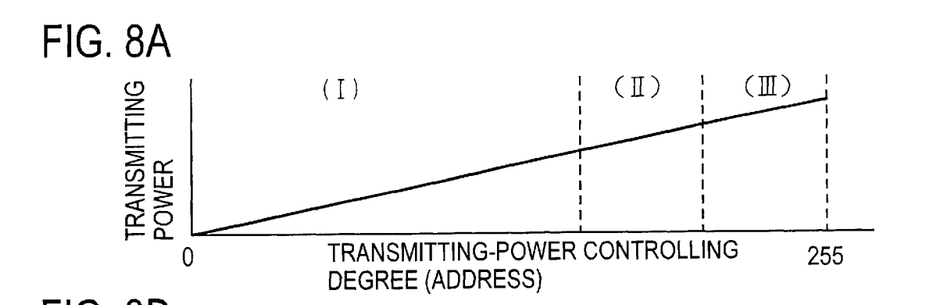
FIG. 8A is a graph showing the relationship of the transmitting power to its controlling degree in FIG. 7.

FIG. 8A shows, like FIG. 3A, the relationship between the transmitting power controlling degree (corresponding to the address) and the transmitting power of the radio transmission amplifier unit of FIG. 7; this example also divides the transmitting power controlling degree into three regions (I), (II) and (III), and effects control to increase the efficiency of the amplifier unit in each region.

Figure 6B:
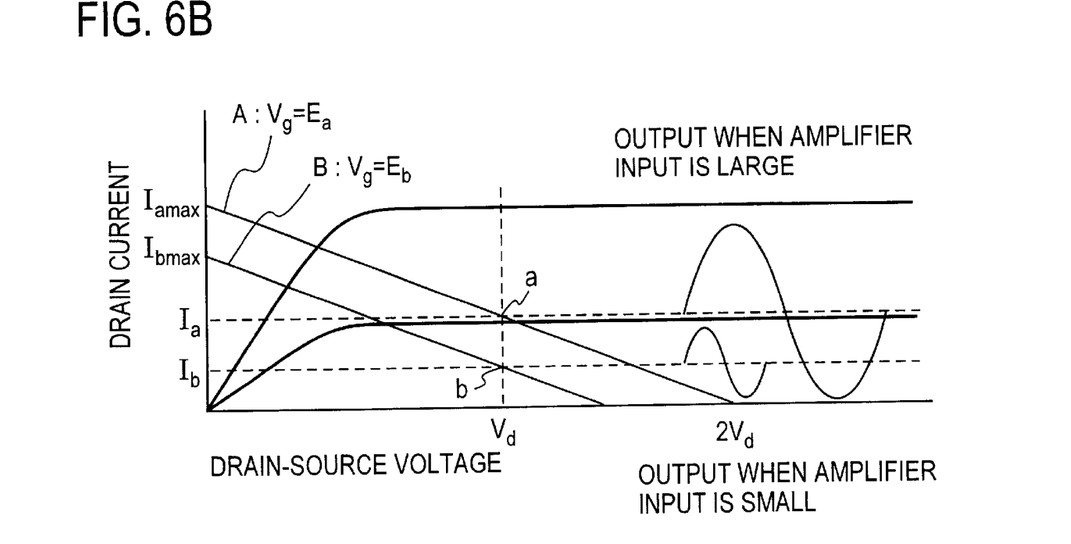
FIG. 6B is a graph showing a drain current vs. drain-source voltage characteristic and load curves, for explaining how to reduce dissipation current by gate bias control of the FET amplifier in FIG. 6A.
Figure 8B:
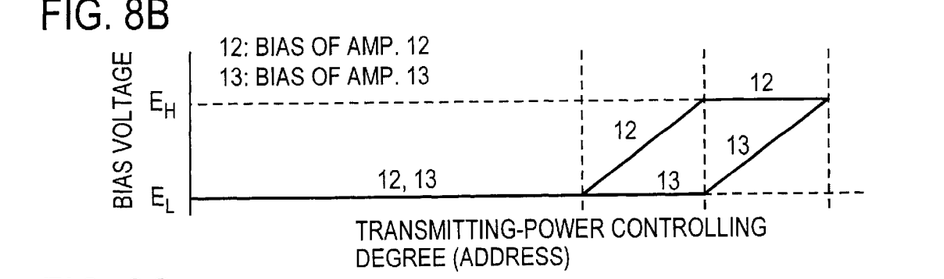
FIG. 8B is a graph showing, by way of example, gate bias voltages for the amplifiers 12 and 13 in three regions of the transmitting power controlling degree in FIG. 7.
Figure 8C:
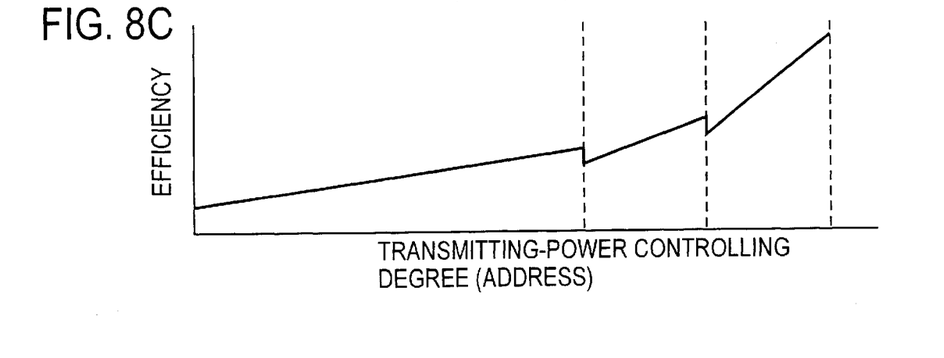
FIG. 8C is a graph conceptually showing the operation efficiency by control in FIG. 8B.

FIG. 8B depicts an example of gate bias control for the pre- and main amplifiers 12 and 13. In the small transmitting power region (I) the switches 51 and 52 are connected to the voltage $E_L$ and the switches 54 and 55 are turned OFF so that the minimum gate bias voltage $E_L$ is applied to the two amplifiers 12 and 13. Accordingly, in this region the amplifiers 12 and 13 are set, for instance, on the load curve B as described previously with respect to FIG. 6B, and consequently, the drain current at their operating point takes a small value $I_b$, making it possible to enhance the operation efficiency of the amplifiers 12 and 13 as a whole in this region as depicted in FIG. 8C.

In the medium transmitting power region (II) the amplifier 13 is supplied with the same low gate bias voltage $E_L$ as in the region (I) in this example. Hence, the switches 52 and 55 are in the same state as in the case of the region (I). The amplifier 12 is supplied with a gate bias voltage that goes higher with an increase in the transmitting power controlling degree as shown in FIG. 8B. That is, in the region (II) the output voltage of the voltage converter 53 is applied to the terminal 12G by turning OFF the switch 51 and ON the switch 54. The voltage converter 53 varies the output voltage from $E_L$ to $E_H$ with the transmitting power controlling degree in the region (II). Accordingly, in this region, as the gate bias varies from $E_L$ to $E_H$, the load line described previously with reference to FIG. 6B gradually shifts from the position B to A.

In the large transmitting power region (III), as shown in FIG. 8B, the gate bias voltage $V_g$ for the amplifier 12 is held at the maximum value $E_H$, and the gate bias voltage for the amplifier 13 is gradually increased from $E_L$ to $E_H$ with the transmitting power controlling degree. That is, in this region (III) the bias voltage $E_H$ is applied to the gate bias terminal 12G of the amplifier 12 by connecting the switch 51 to the high bias voltage $E_H$ and turning OFF the switch 54. On the other hand, the output voltage of the voltage converter 53 is applied to the gate bias terminal 13G of the amplifier 13 by turning OFF the switch 52 and ON the switch 55. In this region, too, the voltage converter 53 outputs a voltage that varies from $E_L$ to $E_H$ with the transmitting power controlling degree.

In the control signal generator 25 formed by a memory there are prestored, at each address corresponding to one particular value of the transmitting power controlling degree, control signals that are used to specify the gain to be set in the gain-controlled amplifier 11, the connections of the switches 51, 52, 54 and 55, and the voltage to be converted by the voltage converter 53; the output from the up-down counter is used as an address to read out these control signals.

As described above, according to the FIG. 7 embodiment, by controlling the bias voltages for the inputs of the pre- and main amplifiers 12 and 13, the operation efficiency of the radio transmission amplifier unit is greatly improved in the region (I) wherein the transmitting power controlling degree is small, and in the medium and large regions (II) and (III), too, the efficiency is improved by the bias voltage control. Incidentally, while the above embodiment has been described in connection with the case where the transmitter of the mobile station generates the transmitting power controlling degree in response to the transmitting power control signal from the base station in the mobile radio system, the amplifier unit of the present invention is not limited specifically thereto; for example, it is possible to set a desired transmitting power in the transmitter by the user of the transmitting device without using the up-down counter 24 and to apply the set transmitting power as the transmitting power controlling degree to the control signal generator 25. This also applies to the embodiments described below.

FIG. 9 illustrates an embodiment which combines the amplifier power-supply ON/OFF control in the FIG. 2A embodiment and the amplifier gate-bias control in the FIG. 7 embodiment. In FIG. 9 the parts corresponding to those in FIG. 2B and 7 are marked with the same reference numerals. In the embodiment, in the small transmitting power controlling region (I) the power supplies to the pre- and main amplifiers 12 and 13 are turned OFF so that the output from the gain-controlled amplifier 11 is provided to the terminal 14 (via the route A-B-E-F-G-D), and in the medium transmitting power controlling region (II) the power supply to the main amplifier 13 is turned OFF so that the output from the pre-amplifier 12 is provided to the output terminal 14 (via the route A-B-C-F-G-D). For the sake of brevity, however, the switches 15, 16, 18, 19, 21 and 22 for route switching use, depicted in FIGS. 2A and 4, are not shown but only the route points A, B, C, D, E, F and G are shown.

As is the case with FIG. 7, the power-supply battery 27 provides a power-supply voltage $E_S$ to the power-supply terminals 12D and 13D of the amplifiers 12 and 13 via switches 28 and 29 and, at the same time, provides the high bias voltage $E_H$ and the low bias voltage $E_L$ to the voltage converter 53. Furthermore, the battery is capable of providing the high bias voltage $E_H$ to the gate bias terminals 12G and 13G via the switches 51 and 52. The voltage converter 53 is capable of outputting a desired voltage in the range of from the voltage $E_L$ to $E_H$ in response to a control signal and providing the output voltage to the gate bias terminals 12G and 13G via the switches 54 and 55.

In the small transmitting power controlling region (I), since only the gain-controlled amplifier 11 is used as described previously with reference to FIG. 4, the switches 51, 52, 54 and 55 are all turned OFF and the switches 28 and 29 leading to the power-supply terminals 12D and 13D of the pre- and main amplifiers 12 and 13 so that the output from the gain-controlled amplifier 11 provided to the terminal 14 via the route B-E-F-G-F.

In the medium transmitting power controlling region (II), the switches 52 and 55 are both turned OFF so as to bypass the main amplifier 13 as referred to previously. Moreover, the switch 51 is turned OFF and the switch 54 ON to supply the output from the voltage converter 53 to the gate bias terminal 12G of the pre-amplifier 12, and as depicted in FIG. 10A, the output from the voltage converter 53 is varied from $E_L$ to $E_H$ with an increase in the transmitting power controlling degree in this region.

In the large transmitting power controlling region (III), the switch 52 is turned OFF and the switch 55 ON to apply the output voltage from the voltage converter 53 to the gate bias terminal 13G of the main amplifier 13, and as depicted in FIG. 10A, the output voltage from the voltage converter 53 is varied from $E_L$ to $E_H$ as the transmitting power controlling degree is increased in this large transmitting power controlling region. Furthermore, the switch 51 is turned ON and the switch 54 OFF to apply the maximum bias voltage $E_H$ to the gate bias terminal 12G of the pre-amplifier 13.

By such control as described above, the amplification efficiency with respect to the transmitting power controlling degree improves in any of the small, medium and large transmitting power regions (I), (II) and (III) as compared with the efficiency obtainable with the prior art. The transmitting power controlling degree, which is the output from the up-down counter 24, is provided as an address to the control signal generator 25 formed by a memory, from which the corresponding control signal is read out to set the gain of the gain-controlled amplifier 11, the voltage to be converted by the voltage converter 53 and the connection of the switches 28, 29, 51, 52, 54 and 55 and the switches 15, 16, 18, 21 and 22 referred to in respect of FIG. 4.

The efficiency of the pre- and main amplifiers 12 and 13, each formed by the FET as described previously, can be raised by operating them as Class C amplifiers. The embodiments described above perform Class AB amplification, but distortion occurs more or less. This distortion is affected, in particular, by the temperature and power-supply voltage of the main amplifier 13. Referring to FIG. 11, an example will be described below which compensates for this distortion. In FIG. 11 signals on two paths from a D/A converter 61 undergoes quadrature modulation by an quadrature modulator 62, and the modulated output is amplified by an amplifier 17, thereafter being provided to the output terminal 14. The temperature of the amplifier 17 is detected by a temperature sensor 63 and the detected temperature signal is converted by an A/D converter 69 to digital form. This digital value, the operating power-supply voltage of the amplifier 17 and a modulation signal $S_i$ from a modulation signal generator 64 are fed into an address generator 65, and an address generated by the address generator 65 is used to read out of a distortion compensating signal generator 66 formed by a memory a distortion compensating signal $\phi_i$. The distortion compensating signal $\phi_i$ and the modulation signal $S_i$ are linearly combined in a distortion compensating circuit 67, and the combined output $S_i + \phi_i$ is applied to the D/A converter 61.

Figure 12:
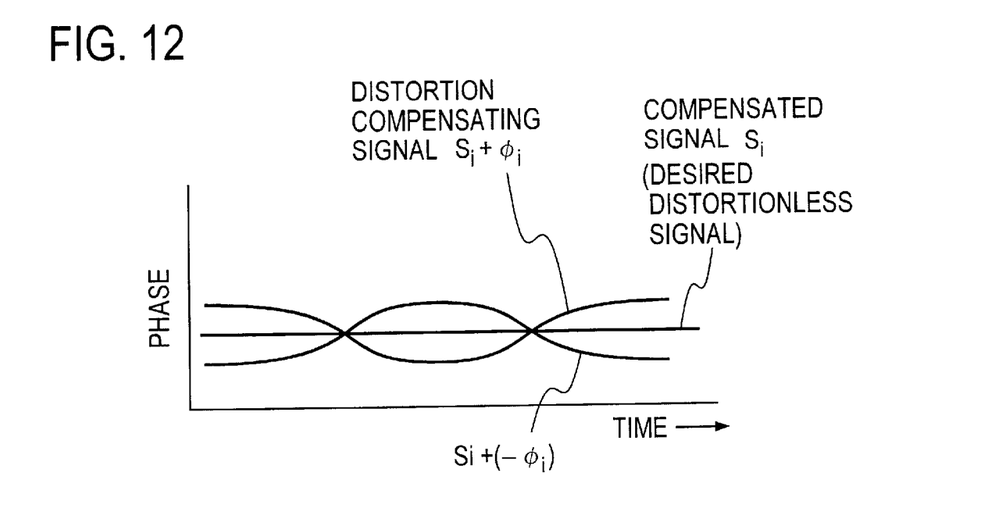

As depicted in FIG. 12, the modulation signal $S_i$ undergoes a phase distortion ($-\phi_i$) in the amplifier 17, but a signal $\phi_i$ which cancels the distortion $-\phi_i$ is added to the signal $S_i$ and the added signal is fed to the quadrature modulator 62; hence, the modulation signal provided as the output from the amplifier 17 becomes a distortionless signal $S_i$.

Figure 13:
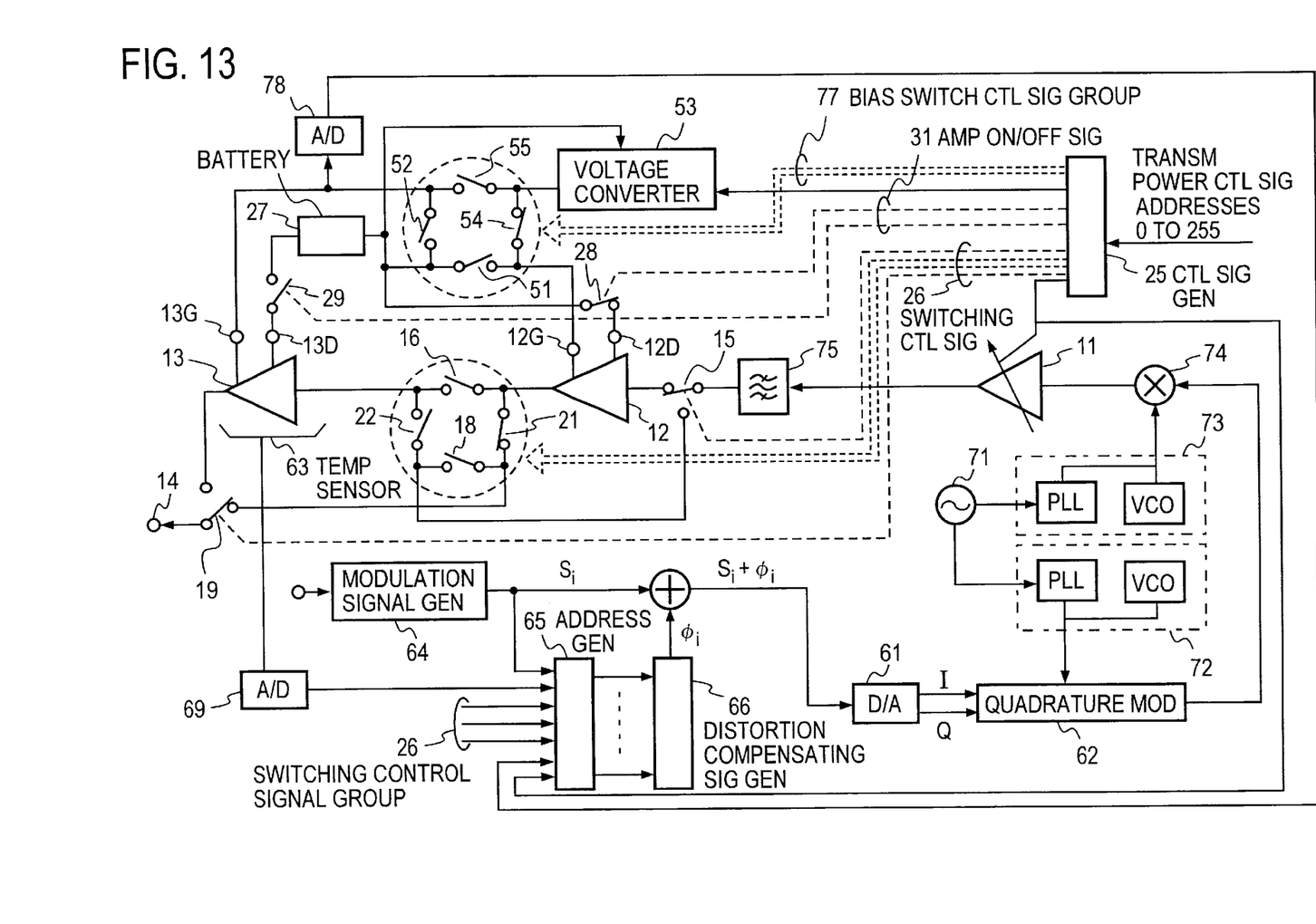
FIG. 13 is a block diagram illustrating another embodiment of the present invention adapted for distortion-compensated, low-power-consumption transmission.

FIG. 13 illustrates an example of a combination of the embodiments described above. In FIG. 13 the parts corresponding to those in FIG. 2A, 4, 7A and 10 are identified by the same reference numerals and no description will be repeated with respect to them. A carrier signal of an oscillator 72 composed of a PLL and a VCO, based on a signal of a reference signal generator 71 is fed to the quadrature modulator 62, and the output from the quadrature modulator 62 is provided to the gain-controlled amplifier 11 after being up-converted in a frequency converter 74 by a high-frequency carrier signal from an oscillator 73 composed of a PLL and VCO, based on the signal of the reference signal generator 71. The output from the gain-controlled amplifier is fed to the pre-amplifier 12 via an intermediate-frequency filter 75. The control signal generator 25 is adapted to generate also a signal 76 which controls the voltage to be converted by the voltage converter 53 and a bias switching control signal group 77 which controls the switches 51, 52, 54 and 55 to switch between the input-side bias terminals 12G and 13G of the amplifiers 12 and 13 and the battery 27 and the voltage converter 53. Moreover, the voltage of the battery 27 is provided as the power-supply voltage to the address generator 65 after being converted by an A/D converter 78 to a digital value, and the switching control signal group 26 is also applied to the address generator.

EFFECT OF THE INVENTION

As described above, according to the present invention, the operation efficiency of the radio transmission amplifier unit can be enhanced by bypassing the pre-amplifier 12 and/or the main amplifier 13 according to the transmitting power level and turning OFF the power supply to the bypassed amplifier. Besides, by effecting gain control for the gain-controlled amplifier 11 in accordance with the transmitting power level, the amplifier efficiency can be made relatively high at both medium and small levels, and the power consumption can be reduced. Alternatively, the efficiency can be raised by shifting the amplifier load curve by controlling the input-side bias voltages to the pre- and main amplifiers 12 and 13 in accordance with the transmitting power.

Moreover, the use of a distortion compensating means increases the efficiency although distortion occurs a little in the amplifier, that is, it is possible to achieve highly efficient amplification with the distortion compensated for.

What is claimed is:

1. A radio transmission amplifier unit which amplifies a signal fed to an input terminal and provides the amplified signal to an output terminal, comprising:

a plurality of amplifiers provided between said input terminal and said output terminal and each having a power supply terminal;

power supply means for supplying power to said plurality of amplifiers;

power-supply switching means for selectively connecting said power supply means to the power supply terminals of said plurality of amplifiers to supply thereto power;

route switching means for switching the cascade connection of said plurality of amplifiers to connect the output of a selected one of said amplifiers to said output terminal; and control signal generating means for generating switch control signals which specify the connection by said power-supply switching means and the state of connection by said route switching means in accordance with a transmitting power controlling degree corresponding to the transmitting power level and for applying said switch control signals to said power-supply switching means and said route switching means, respectively.

2. The unit of claim 1, wherein said control signal generating means comprises: transmitting power controlling degree generating means for outputting a transmitting power controlling degree corresponding to a required transmitting power level; and a control signal generator for generating said switch control signals in accordance with said transmitting power controlling degree.

3. The unit of claim 1 or 2, wherein: the transmitting power level is divided into a predetermined number of regions; and said control signal generating means generates switch control signal for specifying the connection of said power-supply switching means and the connection of said route switching means for each of said regions.

4. The unit of claim 2, wherein: at least one of said plurality of amplifiers is a gain-controlled amplifier; and said control signal generator generates a gain control signal for controlling the gain of said gain-controlled amplifier in accordance with said transmitting power controlling degree.

5. The unit of claim 2, wherein: said control signal generator includes memory means in which there are prestored, in an address area corresponding to said transmitting power controlling degree, said switch control signals which specify the connection of said power-supply switching means and said route switching means in accordance with said transmitting power controlling degree; and said transmitting power controlling degree provided to said memory means is used as an address to read out therefrom said switch control signals and said gain control signal in the corresponding address area, said switch control signals and said gain control signal being applied to the respectively corresponding parts.

6. The unit of claim 5, wherein: at least one of said plurality of amplifiers is a gain-controlled amplifier; said control signal generator generates a gain control signal for controlling the gain of said gain-controlled amplifier; and said memory means has stored, in its address area corresponding to said transmitting power controlling degree, said gain control signal corresponding thereto.

7. The unit of claim 4 or 6, wherein: said plurality of amplifiers includes first and second amplifiers cascade-connected to the output side of said gain-controlled amplifier; said transmitting power level is divided in predetermined small, medium and large regions; and said control signal generating means is means which:

in said small transmitting power level region, disconnects said power supply means by said power-supply switching means from said power-supply terminals of said first and second amplifiers, and selects and connects the output of said gain-controlled amplifier by said route switching means to said output terminal, thereby changing the gain of said gain-controlled amplifier in accordance with said transmitting power controlling degree;

in said medium transmitting power level region, connects said power supply means by said power-supply switching means to the power-supply terminal of said first amplifier and disconnects said power supply means from the power-supply terminal of said second amplifier, connects said gain-controlled amplifier and said first amplifier in cascade by said route switching means and, at the same time, selects and connects the output of said first amplifier to said output terminal, thereby changing the gain of said gain-controlled amplifier in accordance with said transmitting power controlling degree; and in said large transmitting power level region, connects said power supply means by said power-supply switching means to said power-supply terminals of said first and second amplifiers, and selects and connects the output of said second amplifier by said route switching means to said output terminal, thereby changing the gain of said gain-controlled amplifier in accordance with said transmitting power controlling degree.

8. The unit of claim 2, wherein: said power supply means outputs at least first and second different bias voltages; bias select switching means is provided for selectively providing said first and second bias voltages to the input side of at least one of said plurality of amplifiers to set said at least one amplifier at a different operating point; and said control signal generator generates a bias control signal for selecting either one of said first and second bias voltages and provides said bias control signal to said bias select switching means.

9. The unit of claim 2, wherein said control signal generator generates a bias control signal that specifies a variable bias voltage in accordance with said transmitting power controlling degree, and said unit includes: voltage converting means for converting a voltage provided thereto from said power supply means to a specified bias voltage in response to said bias control signal; and bias select switching means for selectively providing said bias voltage to the input side of at least one of said plurality of amplifiers to set its operating point corresponding to said bias voltage.

10. The unit of claim 2, wherein: said plurality of amplifiers include first and second amplifiers; said power supply means outputs first and second different bias voltages; said unit includes voltage converting means supplied with said first and second bias voltages from said power supply means, for outputting a converted voltage of a value between said first and second bias voltages in accordance with said transmitting power controlling degree, and bias select switching means for selectively providing said first and second bias voltages and the converted output voltage of said voltage converting means as a bias voltage to the input side of each of said first and second amplifiers; and said control signal generating means outputs a bias switch control signal for controlling the selection of said bias select switching means in correspondence to said transmitting power controlling degree, and a bias voltage control signal for specifying the conversion voltage of said voltage converting means in accordance with the said transmitting power controlling degree.

11. The unit of claim 10, wherein: said plurality of amplifiers include a gain-controlled amplifier connected in cascade to said first and second amplifiers; said transmitting power level is divided into predetermined at least small, medium and large regions; said first and second bias voltages set different operating points for said first and second amplifiers; and said control signal generating means is means which:

in said small transmitting power level region, disconnects said power supply means by said power-supply switching means from said power-supply terminals of said first and second amplifiers, selects and connects the output of said gain-controlled amplifier by said route switching means to said output terminal, and cuts off, by said bias select switching means, the bias voltages from said power supply means to said first and second amplifiers, thereby changing the gain of said gain-controlled amplifier in accordance with said transmitting power controlling degree;

in said medium transmitting power level region, connects said power supply means by said power-supply switching means to the power-supply terminal of said first amplifier and disconnects said power supply means from the power-supply terminal of said second amplifier, connects said gain-controlled amplifier and said first amplifier in cascade by said route switching means and, at the same time, selects and connects the output of said first amplifier to said output terminal, provides the output from said voltage converting means as a bias voltage to the input side of said first amplifier and said second bias voltage to the input side of said second amplifier, thereby changing the gain of said gain-controlled amplifier in accordance with said transmitting power controlling degree and, at the same time, changing the converted output voltage of said voltage converting means correspondingly; and in said large transmitting power level region, connects said power supply means by said power-supply switching means to said power-supply terminals of said first and second amplifiers, connects said gain-controlled amplifier and said first and second amplifiers in cascade by said route switching means and selects and connects the output of said second amplifier to said output terminal, provides said first bias voltage to the input side of said first amplifier and the converted output voltage of said voltage converting means as a bias voltage to the input side of said second amplifier, thereby changing the gain of said gain-controlled amplifier in accordance with said transmitting power controlling degree and, at the same time, changing the converted output voltage of said voltage converting means correspondingly.

12. A radio transmission amplifier unit which amplifies a signal fed to an input terminal and provides the amplified signal to an output terminal, comprising:

a plurality of amplifiers provided between said input terminal and said output terminal and each having a power supply terminal;

power supply means for outputting at least first and second different bias voltages;

bias select switching means for selectively providing either one of said first and second bias voltages to the input sides of said plurality of amplifiers to selectively set their operating points; and control signal generating means for generating a bias selection control signal which controls the selection of said bias selection switching means;

wherein: said control signal generating means generates a bias control means for specifying a variable bias voltage in accordance with said transmitting power level; and amplifier unit further comprises voltage converting means for converting a voltage from said power supply means to a variable bias voltage specified by said bias control signal; and said bias select switching means responds to said bias control signal to selectively apply any one of said first and second bias voltages and said variable bias voltage to the input sides of said plurality of amplifiers to set them at the corresponding operating points.

13. A radio transmission amplifier unit which amplifies a signal fed to an input terminal and provides the amplified signal to an output terminal, comprising:

a plurality of amplifiers provided between said input terminal and said output terminal and each having a power supply terminal;

power supply means for outputting at least first and second different bias voltages;

bias select switching means for selectively providing either one of said first and second bias voltages to the input sides of said plurality of amplifiers to selectively set their operating points; and control signal generating means for generating a bias selection control means which controls the selection of said bias select switching means;

wherein said control signal generator comprises transmission power controlling degree generating means for outputting a transmitting power controlling degree corresponding to a requested transmitting power level, and a control signal generator for generating the switch control signal corresponding to said transmitting power controlling degree.

14. The unit of claim 13, wherein: at least one of said plurality of amplifiers is a gain-controlled amplifier; and said control signal generator generates a gain control signal for controlling the gain of said gain-controlled amplifier in accordance with said transmitting power controlling degree.

15. The unit of claim 14, wherein: said control signal generator includes memory means in which there are prestored, in an address area corresponding to said transmitting power controlling degree, said switch control signal for specifying the connection of said bias select switching means in accordance with said transmitting power controlling degree, said gain control signal for controlling the gain of said gain-controlled amplifier in accordance with said transmitting power controlling degree, and said bias control signal for specifying the converted output voltage of said voltage converting means; and said transmitting power controlling degree provided to said memory means is used as an address to read out therefrom said switch control signals and said gain control signal in the corresponding address area, said switch control signal and said gain control signal being applied to the respectively corresponding parts.

16. The unit of claim 15, wherein: said plurality of amplifiers includes first and second amplifiers; a predetermined range of said transmitting power level is divided into predetermined small, medium and large regions; said two bias voltages are a first bias voltage for setting a first operating point of the amplifier, and a second bias voltage for setting a second operating point at which an output of a higher level than at said operating point can be provided;

in said small transmitting power level region, said first bias voltage is applied to the input sides of said first and second amplifiers, thereby changing the gain of said gain-controlled amplifier in accordance with said transmitting power controlling degree;

in said medium transmitting power level region, the output from said voltage converting means is provided as a bias voltage to the input side of said first amplifier, said second bias voltage is applied to the input side of said second amplifier, thereby changing the gain of said gain-controlled amplifier in accordance with said transmitting power controlling degree and, at the same time, changing the converted output voltage of said voltage converting means correspondingly; and in said large transmitting power level region, said first bias voltage is provided to the input side of said first amplifier and the converted output voltage of said voltage converting means is provided as a bias voltage to the input side of said second amplifier, thereby changing the gain of said gain-controlled amplifier in accordance with said transmitting power controlling degree and, at the same time, changing the converted output voltage of said voltage converting means correspondingly.

17. The unit of claim 4, 11, or 14, wherein said gain-controlled amplifier is provided as a first stage of said unit and which comprises:

a temperature sensor for detecting the temperature of a last-stage one of said plurality of amplifiers;

an address generator supplied with a detected temperature signal from said temperature sensor and a modulated version of a signal to be amplified by said main amplifier, for generating an address;

a distortion compensating signal generator formed by a memory which is read out by said address, for generating a distortion compensating signal; and a distortion compensating circuit connected to the preceding stage of said gain-controlled amplifier, for combining said modulated signal with said distortion compensating signal.

18. The unit of claim 17, wherein the switch control signal and the gain control signal from said control signal generating means are also input as an address into said distortion compensating signal generator.

* * * * *